United States Patent
Becker et al.

(10) Patent No.: US 8,946,090 B2
(45) Date of Patent: Feb. 3, 2015

(54) METHOD FOR ETCHING A LAYER ON A SILICON SEMICONDUCTOR SUBSTRATE

(75) Inventors: Volker Becker, Marxzell (DE); Franz Laermer, Weil der Stadt (DE); Tino Fuchs, Tuebingen (DE); Christina Leinenbach, Ensdorf (DE)

(73) Assignee: Robert Bosch GmbH, Stuttgart (DE)

( * ) Notice: Subject to any disclaimer, the term of this patent is extended or adjusted under 35 U.S.C. 154(b) by 562 days.

(21) Appl. No.: 12/452,692

(22) PCT Filed: Jul. 2, 2008

(86) PCT No.: PCT/EP2008/058539
§ 371 (c)(1),
(2), (4) Date: Apr. 26, 2010

(87) PCT Pub. No.: WO2009/010391
PCT Pub. Date: Jan. 22, 2009

(65) Prior Publication Data
US 2010/0203739 A1    Aug. 12, 2010

(30) Foreign Application Priority Data

Jul. 19, 2007 (DE) .......................... 10 2007 033 685

(51) Int. Cl.
*H01L 21/302* (2006.01)
*H01L 21/3065* (2006.01)
*H01L 21/306* (2006.01)
*H01L 21/02* (2006.01)
*B81C 1/00* (2006.01)
*H01L 21/3213* (2006.01)

(52) U.S. Cl.
CPC ...... *H01L 21/3065* (2013.01); *H01L 21/30621* (2013.01); *H01L 21/02019* (2013.01); *B81C 1/00531* (2013.01); *B81C 1/00595* (2013.01); *H01L 21/32135* (2013.01); *B81C 2201/0132* (2013.01); *B81C 2201/0138* (2013.01)
USPC .......................................... 438/706; 438/689

(58) Field of Classification Search
None
See application file for complete search history.

(56) References Cited

U.S. PATENT DOCUMENTS

| 6,635,185 | B2 * | 10/2003 | Demmin et al. ................. 216/64 |
| 2005/0028934 | A1 * | 2/2005 | Miya et al. ............... 156/345.33 |
| 2005/0257747 | A1 * | 11/2005 | Wakabayashi et al. ....... 118/728 |
| 2006/0006057 | A1 * | 1/2006 | Laermer ...................... 204/164 |
| 2007/0042569 | A1 * | 2/2007 | Dip et al. ...................... 438/478 |

FOREIGN PATENT DOCUMENTS

| DE | 102 29 037 | 1/2004 |
| WO | 2004/002882 | 1/2004 |
| WO | 2006/013137 | 2/2006 |

OTHER PUBLICATIONS

Leinenbach C., et al.: "A novel sacrificial layer technology based on highly selective etching of silicon-germanium in ClF3" 2007 20th IEEE International Conference on Micro Electro Mechanical Systems—MEMS '07 IEEE Piscataway, NJ, USA 2007, pp. 65-68, XP0024995538 ISBN: 978-1-4244-0950-1.

* cited by examiner

*Primary Examiner* — Shamim Ahmed
*Assistant Examiner* — Bradford Gates
(74) *Attorney, Agent, or Firm* — Kenyon & Kenyon LLP

(57) ABSTRACT

A method for selective etching of an SiGe mixed semiconductor layer on a silicon semiconductor substrate by dry chemical etching of the SiGe mixed semiconductor layer with the aid of an etching gas selected from the group including $ClF_3$ and/or $ClF_5$, a gas selected from the group including $Cl_2$ and/or HCl being added to the etching gas.

22 Claims, 1 Drawing Sheet

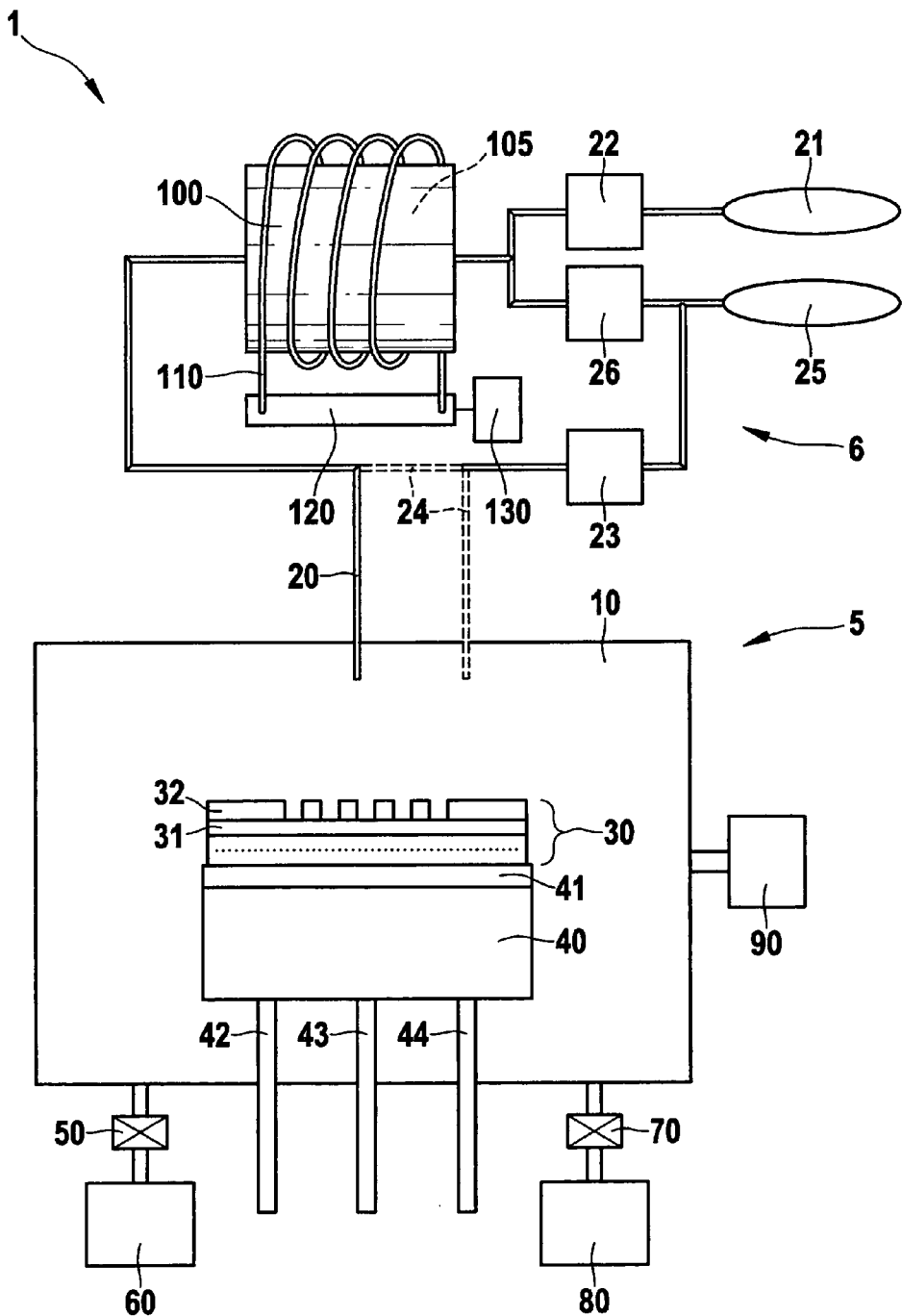

METHOD FOR ETCHING A LAYER ON A SILICON SEMICONDUCTOR SUBSTRATE

FIELD OF THE INVENTION

The present invention relates to a method for etching an SiGe mixed semiconductor layer on a silicon semiconductor substrate by dry chemical etching.

BACKGROUND INFORMATION

In manufacturing semiconductor components, in particular in manufacturing cantilevered sensor structures by surface micromechanical technology, selective removal of a certain layer, a so-called sacrificial layer, selectively with respect to the functional layer, is an often necessary measure. Such a sacrificial layer may be removed, in principle, by dry chemical or wet chemical methods. Sacrificial layers are preferably removed with the aid of gaseous etching media, since when using etching gases, the risk of irreversible adhesion of sensor structure elements to the silicon substrate thereunder or of parts of the sensor structure elements to each other, the so-called sticking risk, is considerably reduced or eliminated.

In manufacturing micromechanical structures or components, silicon is mostly used as a functional layer due to its outstanding properties for these applications. Single-crystal silicon or polycrystalline silicon, in particular the so-called epi-polysilicon, i.e., epitaxially deposited polycrystalline silicon, is often used as a sensor functional layer from which the sensor structure elements are structured. In connection with silicon sensor structure elements, silicon-germanium (SiGe) is a particularly suitable sacrificial layer material.

An etching gas in non-plasma dry chemical etching processes may be chlorine trifluoride ($ClF_3$). Chlorine trifluoride is normally stored in pressurized gas bottles which contain the substance in a liquefied form. Since liquid $ClF_3$ is extremely reactive and, as a strong oxidizer, very hazardous, and since unintended release may cause severe damage, chlorine trifluoride is avoided by many users despite its advantageous properties.

German patent document DE 102 29 037 A1 discusses a method and a device using which $ClF_3$ is produced with the aid of a high-density downstream plasma excitation prior to the actual etching process from relatively harmless gases such as chlorine or HCl on the one hand and sulfur hexafluoride, nitrogen trifluoride or fluorine on the other hand, and subsequently supplied to a process chamber in which etching is carried out.

The disadvantage of the known etching processes is that the achievable selectivity of etching silicon-germanium with respect to silicon limits the manufacture of complex structures and geometries by semiconductor technology using controlled removal of materials, in particular controlled removal of sacrificial layers, for example, in layer stacks, in the manufacturing processes of semiconductor components.

SUMMARY OF THE INVENTION

The method according to the present invention for etching an SiGe mixed semiconductor layer on a silicon semiconductor substrate by dry chemical etching of the SiGe mixed semiconductor layer with the aid of an etching gas selected from the group that includes $ClF_3$ and/or $ClF_5$ has the advantage that increased selectivity of etching silicon-germanium with respect to silicon may be provided in the dry chemical etching process.

This makes it possible to expose existing silicon structures or functional dielectric layers using reduced or even no further protective measures by etching silicon-germanium sacrificial layers. It is advantageous that silicon-germanium may be selectively etched, without passivation of silicon function structures being necessary.

This is achieved according to the exemplary embodiments and/or exemplary methods of the present invention by using a gas selected from the group that includes $Cl_2$ and/or HCl as the etching gas.

The term "silicon" or "Si" will be used hereinafter for any conceivable silicon materials without making any further distinction. Similarly, the term "silicon-germanium" or "SiGe" will be used throughout for any conceivable type of SiGe, polycrystalline or single-crystal SiGe, regardless of the type of deposition or mixing ratios of silicon and germanium.

It was surprisingly found that the addition of chlorine and/or HCl to the etching gas at unchanged partial pressure of the etching gas causes a reduced etching attack on silicon without disadvantageously affecting the etching rate of silicon-germanium. By reducing undesired etching of silicon compared to silicon-germanium, the method according to the present invention makes sacrificial layer etching possible, which allows even thinner or more critically dimensioned silicon functional elements to be manufactured. This allows previously critical design geometries to be manufactured; in particular, further reduced micromechanical structures, in particular sensor structures, may be exposed.

It is of particular advantage that sacrificial layers, for example, of silicon-germanium, may be removed without noticeably etching functional structural elements of silicon or other functional, silicon-based layers such as silicon nitride or silicon oxide.

The increased selectivity achievable via the method according to the present invention advantageously allows greater undercut widths to be achieved. Furthermore, the method according to the present invention makes it possible to increase the etching rate of silicon-germanium, for example, via higher process pressures, without silicon structural elements being noticeably attacked, thanks to the higher selectivity of the method. This makes further improved undercut widths and/or shortened process times possible.

It is highly advantageous that, in particular, very small or very narrow or even very extended planar silicon structures may be exposed, since rapid and very selective etching may be provided.

Exemplary embodiments of the present invention are illustrated in the drawing and explained in greater detail in the description that follows.

BRIEF DESCRIPTION OF THE DRAWING

FIG. 1 shows a system for etching a semiconductor substrate having a device for producing chlorine trifluoride with the aid of high-density plasma excitation.

DETAILED DESCRIPTION

The method according to the present invention is first elucidated as an example in connection with in-situ production of $ClF_3$.

FIG. 1 shows a device 1 including an etching system 5, which has a process chamber 10 in which a semiconductor substrate 30, which may be a silicon wafer having a silicon-germanium mixed semiconductor layer 31, is etched. Etching system 5 is provided with a device 6 for generating chlorine trifluoride ($ClF_3$). Systems associated with devices for generating chlorine trifluoride are disclosed in Patent Specification DE 102 29 037 A1 to which reference is hereby made. The system discussed in Patent Specification DE 102 29 037 A1 and provided with a device for generating chlorine trifluoride differs from the system disclosed according to the exemplary embodiments and/or exemplary methods of the present invention in that no arrangement is provided which would permit additionally adding gases selected from the group including $Cl_2$ and/or HCl to the etching gas produced, for example, chlorine trifluoride. System 5 and device 6 are modified according to the exemplary embodiments and/or exemplary methods of the present invention as needed by creating the option of additionally adding a gas selected from the group including $Cl_2$ and/or HCl to the etching gas, for example, chlorine trifluoride, by feeding it into gas outlet 20 and/or process chamber 10, for example.

In a particularly specific embodiment, $Cl_2$ and/or HCl is/are supplied as a first gas and $NF_3$ is supplied as a second gas to plasma reactor 100, to which a first and a second gas, so-called precursor gases, were supplied. Nitrogen trifluoride and chlorine, for example, react in the plasma to form chlorine trifluoride according to the following stoichiometric reaction: $2NF_3+Cl_2 \rightarrow N_2+2ClF_3$, or nitrogen trifluoride and HCl according to the following stoichiometric reaction: $4NF_3+3HCl \rightarrow 3ClF_3+3HF+2N_2$.

Within the exemplary embodiments and/or exemplary methods of the present invention, the term "stoichiometric" is understood as the mixing ratio which corresponds to the reaction equation for forming the desired end product. The term "stoichiometric" is used hereinafter in particular with reference to the reaction of formation of $ClF_3$ or applied to $ClF_5$.

For this purpose, the $NF_3$ gas is first removed from a first gas container 21, for example, a gas bottle, and the $Cl_2$ or HCl gas is removed from a second gas container 25, for example, a gas bottle, via an associated first mass flow regulator 22 and an associated second mass flow regulator 26, respectively, and supplied to plasma reactor 100. Here, both $N_2$ and, in the case of HCl, also HF, may be produced via high-density plasma excitation of the supplied precursor gases and by converting the plasma fragments to $ClF_3$ and supplied to process chamber 10 via gas outlet 20 for etching semiconductor substrate 30. Inductive plasma 105 may be produced, as indicated in FIG. 1, via an inductive coil 110 connected to an adaptation network 120 and a high-frequency generator 130 via a microwave field, for example, by using a hollow conductor.

Process chamber 10 has a substrate electrode 40, on which a silicon wafer may be clamped as semiconductor substrate 30.

This clamping may take place via a clamping device 41, for example, an electrostatic chuck, which also protects the supported side of semiconductor substrate 30 against the gases in process chamber 10. Helium may also be supplied to the supported side of semiconductor substrate 30, in order to achieve a good thermal adhesion to substrate electrode 41 and additional insulation against the gases in process chamber 10. Substrate electrode 40 also has incoming and outgoing electric leads 42 for clamping device 41 and electric heating, which may also be provided in substrate electrode 41 for temperature control or temperature setting. Measured data, for example, the electrode temperature or the helium backside pressure, may also be transmitted to the outside via incoming and outgoing electric leads 42. Furthermore, substrate electrode 40 has a gas inlet and a gas outlet 43, via which He may be fed or removed as a convection medium for cooling semiconductor substrate 30 at an adjustable pressure. Another feed or removal 44 allows a cooling medium to circulate through substrate electrode 40 to adjust its temperature and, in particular, to remove reaction heat generated by an exothermal etching reaction on semiconductor substrate 30. The substrate temperature may be −30° C. to 30° C. for optimal etching conditions and mask selectivity. It was found that very good selectivity or even maximum selectivity is achievable at temperatures in the range of ≥18° C. to ≤30° C., which may be in the range of ≥18° C. to ≤25° C., and which may be at temperatures around 20° C. Fluorinert® or glycol-water mixtures may be used as the cooling medium.

Process chamber 10 has a first pump 60, in particular a turbomolecular pump, and a second pump 80, in particular a rotary vane pump, which may be coupled so that rotary vane pump 80 may be used from time to time or permanently as a prepump for turbomolecular pump 60. Rotary vane pump 80, which may be a dry-running pump, is used for "roughing" the entire system 5 after venting and as a process pump to remove the process gases while an etching process is being performed. A regulating valve 70 is used for pressure regulation. The pressure is measured via a pressure gauge 90, which may be designed as a baratron or as a combination baratron and ionivac. Pressure gauge 90 and regulating valve 70 are used for setting a stable pressure during the processing of semiconductor substrate 30. Turbopump 60 in combination with a shut-off valve 50 is used for achieving the best possible final vacuum before and after processing, for example, better than $10^{-4}$ Pa. In one specific embodiment of the system, turbopump 60 may be isolated from process chamber 10 via shutoff valve 50 during the process, since it is not usable at process pressures in the mbar range, and contact with aggressive process gases may thus be prevented. If process pressures <1 mbar are used, it is, of course, also possible to use the turbomolecular pump continuously during the process in order to be able to hold these low process pressures during the entire process.

Semiconductor substrate 30 has a silicon-germanium layer 31 and a silicon functional layer 32 thereon. Both polycrystalline and single-crystal silicon-germanium layers are suitable, which may also be deposited epitaxially. In particular, epitaxially deposited polysilicon, so-called epipolysilicon, layers may be used as functional layers. Single-crystal silicon may also be deposited epitaxially on single-crystal silicon-germanium. According to the exemplary embodiments and/or exemplary methods of the present invention, the SiGe layer is removed by dry-chemical etching, using $ClF_3$ as an etching gas, to which another gas from the group including $Cl_2$ and/or HCl is added selectively with respect to silicon functional layer 32 and silicon semiconductor substrate 30 thereunder.

The addition of $Cl_2$ and/or HCl is controlled via another mass flow regulator 23 and/or via mass flow regulator 26.

In a first specific embodiment, the gas selected from the group including $Cl_2$ and/or HCl is added to the etching gas by supplying an excess of the first gas $Cl_2$ and/or HCl with respect to the second gas, which may be $NF_3$, to plasma reactor 100. This proportion of chlorine or HCl, which is greater than the stoichiometric ratio for producing $ClF_3$, is controlled via mass flow regulator 26. In this specific embodiment, it is advantageous in particular that when forming $ClF_3$ from $NF_3$ using plasma excitation in plasma reactor 100, the free fluorine radicals formed during the reaction due to the added excess chlorine may react completely or almost completely with the excess chlorine. This results in the considerable advantage that no or almost no free fluorine radicals reach the process chamber where they would highly unfavorably affect the selectivity of sacrificial layer etching of a silicon-germanium layer with respect to silicon, since they etch both silicon-germanium and silicon indistinctly. This is advantageous in particular, since fluorine radicals in the gaseous form have a relatively long life and a long free path, so that they may reach process chamber 10 from plasma reactor 100.

In contrast with fluorine radicals, chlorine radicals formed under $Cl_2$ or HCl plasma excitation have a short life in the gas-filled chamber and therefore have a short free path. They do not reach process chamber 10 in the form of radicals, but predominantly in the form of chlorine molecules $Cl_2$ or interhalide compounds of the form ClF. ClF has very low reaction rates with respect to both silicon and silicon-germanium, so that, in general, in dry etching according to the exemplary embodiments and/or exemplary methods of the present invention using etching gases such as $ClF_3$, it may be considered neutral for SiGe layer etching. Nitrogen formed under plasma excitation may also be considered irrelevant for dry etching, since the inert gas nitrogen, like argon, has no significant influence on the selectivity of the etching process.

In a specific embodiment, the gas selected from the group including $Cl_2$ and/or HCl is fed to the formed chlorine trifluoride, which may be first underneath plasma reactor 100. This feed is controlled via mass flow regulator 23. The chlorine and/or HCl may be added to the formed chlorine trifluoride by feeding them into gas inlet 20 via mass flow regulator 23. In this specific embodiment, the formed $ClF_3$ and the added chlorine and/or HCl reach process chamber 10 by being jointly fed through gas inlet 20.

As a particular advantage of the second specific embodiment of a joint feed of the formed $ClF_3$ and any other reaction products formed in plasma reactor 100 and of the added chlorine gas and/or hydrogen chloride into process chamber 10, it should be emphasized that undesirable free fluorine radicals may be captured from plasma reactor 100 by adding chlorine or HCl on the way from plasma reactor 100 to process chamber 10 via gas inlet 20. Like chlorine, HCl also captures fluorine in a "titration reaction," HF and ClF being formed.

In this second specific embodiment, $ClF_3$ is produced by using chlorine or HCl in plasma reactor 100 which may be under stoichiometric or quasi-stoichiometric conditions, i.e., at a stoichiometric ratio of $NF_3$ and $Cl_2$ or HCl to each other for producing $ClF_3$.

This may provide the advantage that, due to an approximately stoichiometric ratio of $NF_3$ to $Cl_2$ with respect to the reaction of formation of $ClF_3$, of what may be approximately 2:1 or of $NF_3$ to HCl of what may be approximately 4:3, it may be avoided that an excessively large proportion of fluorine radicals reacts to form ClF instead of $ClF_3$, which would be ineffective as an etching gas for sacrificial layer etching. Furthermore, by producing $ClF_3$ under stoichiometric or quasi-stoichiometric conditions it may be avoided that an excess amount of chlorine radicals is generated in the plasma and part of the plasma power provided is wasted for forming chlorine radicals, which are useless for dry etching, since, due to their short life, they are subject to back-formation to $Cl_2$ or to a reaction of formation of useless interhalides such as ClF.

In another specific embodiment, chlorine and/or HCl may be added by supplying chlorine and/or HCl to process chamber 10 via an independent feed 24.

It may be particularly preferred to combine the options of adding $Cl_2$ and/or HCl to the etching gas. For example, a ratio which may be slightly above the stoichiometric ratio for the proportion of chlorine (required) for producing $ClF_3$ may be adjusted in plasma reactor 100. The formation of fluorine radicals may be advantageously reduced or prevented here as early as during the production $ClF_3$. Furthermore, a second chlorine gas stream may be additionally added to the $ClF_3$ etching gas into gas feed 20 via mass flow regulator 23 and/or directly into the process chamber via a separate feed 24.

The total gas pressure during the etching process in process chamber 10 is adjustable via the pressure control of etching system 6, in particular via a regulating valve 70 and a pressure gauge 90.

The total pressure of the etching gas and added gas may be in the range of $\geq 0.5$ Pa to $\leq 1000$ Pa, which may be in the range of $\geq 1$ Pa to $\leq 200$ Pa, and which may be in the range of $\geq 20$ Pa to $\leq 100$ Pa.

For the conversion to $ClF_3$, the ratio of the gas flows of $NF_3$ to $Cl_2$ may be approximately 2:1, and the ratio of the gas flows of $NF_3$ to HCl may be approximately 4:3.

The gas flows of the precursor gases $NF_3$ and $Cl_2$ or HCl into plasma reactor 100 may be in the range of $\geq 100$ sccm to $\leq 1$ sLm $NF_3$ and in the range of $\geq 50$ sccm to $\leq 500$ sccm $Cl_2$ and/or $\geq 75$ sccm to $\leq 750$ sccm HCl.

DETAILED DESCRIPTION

In a system 5, as shown in FIG. 1, an SiGe mixed semiconductor layer 31 having a thickness of 2500 nm on a silicon semiconductor substrate 30 is removed by dry chemical plasmaless etching using the method according to the present invention.

As discussed in DE 102 29 037 A1, the etching process took place by initially introducing a silicon wafer into etching system 6 and clamping it on substrate electrode 40. Turbopump 60 pumped chamber 10 and the connected assembly of the gas supply having plasma reactor 100 until the desired basic vacuum was reached. During the entire process, the turbomolecular pump pumped the process chamber with the rotary vane pump as a prepump. The desired quantities of process gases were then supplied with the aid of mass flow regulators 22, 26. In addition, the plasma reaction was started in plasma reactor 100 after stabilizing the gas flows by switching high-frequency generator 130 onto inductive plasma source or coil 110. The pressure in process chamber 10 and thus also in upstream plasma reactor 100 was measured using pressure gauge 90 and stabilized to the desired value with the aid of the combination of rotary vane pump 80 and regulating valve 70.

The silicon wafer was then etched by feeding the $ClF_3$ generated in plasma reactor 100 from the precursor gases, and the $Cl_2$ added according to the exemplary embodiments and/or exemplary methods of the present, invention. For this purpose, $ClF_3$ was produced in situ from precursor gases $NF_3$ and $Cl_2$, which were used at a gas flow of 150 sccm $NF_3$ and 80 sccm $Cl_2$. The produced $ClF_3$ was fed to the process chamber at a $ClF_3$ partial pressure of 27 Pa as a constant parameter. Additional chlorine gas was fed to the formed chlorine trifluoride into gas inlet 20 via mass flow regulator 23. Partial pressures of 15 Pa and 27 Pa $Cl_2$ were used here. Etching took place at a temperature of silicon semiconductor substrate 30 of 20° C., at a total gas pressure of 27 Pa, 42 Pa, or 54 Pa.

Subsequently, as disclosed in DE 102 29 037 A1, the high frequency or microwave supply to plasma reactor 100 was shut off, the process gas feed stopped, and process chamber 10 and the imitation of the gas supply to plasma reactor 100 were evacuated. Finally, with open valve 50, turbopump 60 took over pumping to a lowest possible final pressure of better than $10^{-4}$ Pa, for example. Regulating valve 70 upstream from rotary vane pump 80 is closed in this case, i.e., rotary vane pump 80 may be used during this time as a prepump for turbopump 60. When the basic pressure was reached, the silicon wafer was transferred to a connected lock device.

It was found that at a ClF$_3$ partial pressure of 27 Pa and a ratio of the partial pressures of ClF$_3$ to Cl$_2$ of 1:0.5, the selectivity was nearly doubled, while at a ratio of the partial pressures of ClF$_3$ to Cl$_2$ of 1:1 at a total pressure of 54 Pa, the selectivity was even more than doubled. The following Table 1 illustrates these results:

TABLE 1

| Description | Total Pressure [Pa] | p (ClF$_3$) [Pa] | p (Cl$_2$) [Pa] | p (Ar) [Pa] | Selectivity |
|---|---|---|---|---|---|
| p (ClF$_3$) | 27 | 27 | 0 | 0 | 1000 |
| p (ClF$_3$):p (Cl$_2$) = 1:0.5 | 42 | 27 | 15 | 0 | 1800 |
| p (ClF$_3$):p (Ar) = 1:0.5 | 42 | 27 | 0 | 15 | 1100 |
| p (ClF$_3$) | 27 | 27 | 0 | 0 | 1000 |
| p (ClF$_3$):p (Cl$_2$) = 1:1 | 54 | 27 | 27 | 0 | 2300 |

Although the exemplary embodiments and/or exemplary methods of the present invention has been described on the basis of the exemplary embodiments, it is not limited thereto, but may be modified in multiple ways.

Exemplary embodiments of the method according to the present invention are claimed by the subordinate claims and are elucidated in greater detail below.

In specific embodiments, the ratio of the partial pressures of the etching gas, which may be ClF$_3$, to the added gas selected from the group including Cl$_2$ and/or HCl is in the range of ≥1:5 to ≤5:1, which may be in the range of ≥1:2 to ≤4:1, and which may be in the range of ≥1:1 to ≤2:1.

Adding the gases selected from the group including Cl$_2$ and/or HCl has the advantage that the silicon etching rate is reduced and the SiGe etching rate is not impaired, or may even be increased.

A particular advantage may be provided by achieving considerably increased selectivity with respect to silicon at an unchanged or even slightly increased etching rate for SiGe. It is thus of a great advantage that the selectivity of etching SiGe with respect to silicon may be increased by a factor in the range of ≥2 to ≤5, in particular by a factor of ≥2 to ≤3. This makes it possible to increase the selectivity ratio of etching SiGe with respect to silicon to more than 10000:1, and which may be to a selectivity ratio in the range of 20000:1 to 30000:1.

Dry chemical etching methods may include plasmaless dry chemical etching methods. It is advantageous that by adding Cl$_2$ and/or HCl to the etching gas used, such as ClF$_3$ and/or ClF$_5$, in particular in plasmaless dry chemical etching methods, an increase in selectivity by a factor close to 2 may be achieved even with small amounts, for example, at a ratio of partial pressures of ClF$_3$ to Cl$_2$ of 2:1. For example, the selectivity ratio of SiGe to silicon for a proportion of germanium of 35%, for example, and gas pressures of chlorine and ClF$_3$ in the range of 0.1 Pa to 0.5 Pa, during etching may be increased, for example, from 5000:1 to over 10000:1.

The partial pressure of the added gas selected from the group including Cl$_2$ and/or HCl is, in a process chamber, for example, which may be in the range of ≥0.5 Pa to ≤500 Pa, and which may be in the range of ≥1 Pa to ≤100 Pa, and which may be in the range of ≥20 Pa to ≤50 Pa.

The partial pressure of the etching gas selected from the group including ClF$_3$ and/or ClF$_5$, which may be ClF$_3$, for example in a process chamber where etching takes place, which may be in the range of ≥0.5 Pa to ≤500 Pa, and which may be in the range of ≥1 Pa to ≤100 Pa, and which may be in the range of ≥20 Pa to ≤50 Pa.

The total pressure of the etching gas and added gas may be in the range of ≥0.5 Pa to ≤1000 Pa, and which may be in the range of ≥1 Pa to ≤200 Pa, and which may be in the range of ≥20 Pa to ≤100 Pa.

The gas selected from the group including Cl$_2$ and/or HCl may be added, for example, by feeding Cl$_2$ and/or HCl into a reaction chamber or process chamber into which the etching gas is introduced for etching, and/or added upstream from the reaction chamber, for example, in a shared feed line.

Suitable etching gases, in particular the etching gas chlorine trifluoride, may be stored in commercially available pressure bottles as liquefied gas and removed therefrom in the gaseous form. It may be provided that chlorine trifluoride is produced immediately before the etching process, for example, in a device associated with the process chamber usable for etching, which includes a plasma reactor, from which the chlorine trifluoride may be transferred into the process chamber.

In a specific embodiment, the ClF$_3$ etching gas is produced by generating a high-density plasma in a plasma reactor, a first gas selected from the group including Cl$_2$ and/or HCl and a second gas selected from the group including NF$_3$, F$_2$, and/or SF$_6$, which may be NF$_3$, being supplied to the plasma reactor, and the gases reacting under the effect of a high-density plasma in the plasma reactor, forming chlorine trifluoride.

For example, an excess of chlorine or HCl may be used for plasma production of ClF$_3$. Chlorine and/or hydrogen chloride may be supplied to the formed etching gas, via a second mass flow regulator, for example, in particular in a quantity less than that required for the plasma production of the etching gas, for example, ClF$_3$, while plasma production of ClF$_3$ itself takes place approximately stoichiometrically or at a slight excess of chlorine.

In a specific embodiment, the gas selected from the group including Cl$_2$ and/or HCl is added to the etching gas by supplying an excess of the first gas selected from the group including Cl$_2$ and/or HCl with respect to the second gas, which may be NF$_3$, to the plasma reactor. The ratio of the gas flows, which may correspond to the molar ratio, of the first gas selected from the group including Cl$_2$ and/or HCl to the second gas, which may be NF$_3$, is in the range of ≥1:5 to ≤6:1, and which may be in the range of ≥1:3 to ≤4:1, and which may be in the range of ≥1:2 to ≤2:1.

In this specific embodiment, it is advantageous in particular that, when forming the etching gas using the added excess of Cl$_2$ and/or HCl with respect to the second gas, which may be NF$_3$, the fluorine radicals formed during the reaction may react completely or almost completely with the excess chlorine. This results in the advantage that no or almost no fluorine radicals reach the process chamber where they would unfavorably influence the selectivity of sacrificial layer etching of a silicon-germanium layer with respect to silicon, since they etch both silicon-germanium and silicon indistinctly.

In a specific embodiment, the gas selected from the group including Cl$_2$ and/or HCl is added to the etching gas, which may be the formed chlorine trifluoride, the etching gas, in particular chlorine trifluoride, and the gas selected from the group including Cl$_2$ and/or HCl being jointly supplied to a process chamber in which etching takes place.

One particular advantage of this specific embodiment of a joint feed of the formed etching gas, in particular ClF$_3$ and the added chlorine gas and/or hydrogen chloride, into a process chamber is that undesirable fluorine radicals may be captured by the chlorine and HCl during a joint supply, for example, forming chlorine fluoride (ClF).

In this specific embodiment, $ClF_3$ may be produced, for example, by using chlorine in a ratio of $NF_3$ and $Cl_2$ that is stoichiometric or almost stoichiometric for producing $ClF_3$. This may provide the advantage that, due to an approximately stoichiometric ratio of $NF_3$ to $Cl_2$ of what may be approximately 2:1, it may be avoided that an excessively large proportion of fluorine radicals reacts to form ClF instead of $ClF_3$, which would be ineffective as an etching gas for a sacrificial layer etching. Furthermore, by producing $ClF_3$ in the plasma source under stoichiometric or quasi-stoichiometric conditions it may be avoided that an excess amount of chlorine radicals is generated in the plasma and part of the plasma power provided is wasted for forming chlorine radicals, which are useless for dry etching, since, due to their short life, they are subject to back-formation to $Cl_2$ or to a reaction of formation of useless interhalides such as ClF.

In another specific embodiment, the gases selected from the group including $Cl_2$ and/or HCl may be supplied to the process chamber separately from the formed chlorine trifluoride.

It may be particularly advantageous to combine the options of adding $Cl_2$ and/or HCl to the etching gas. A stoichiometric ratio or a ratio slightly above the stoichiometric may be set for the proportion of chlorine or HCl for producing the etching gas, in particular $ClF_3$. The formation of fluorine radicals may be advantageously reduced or prevented here as early as during the production of $ClF_3$. Furthermore, additional $Cl_2$ and/or HCl may be added to the produced etching gas, in particular $ClF_3$; $Cl_2$ and/or HCl may be supplied to the etching gas in a process chamber or reaction chamber, for example, jointly with or separately from the etching gas, in particular $ClF_3$.

It may be preferred in particular that the etching gas, for example, $ClF_3$, is produced for generating the etching gas by using chlorine at stoichiometric or quasi-stoichiometric ratios of the first to the second gas, for example, of $NF_3$ to $Cl_2$, and additional $Cl_2$ and/or HCl is added to the produced etching gas, in particular $ClF_3$, $Cl_2$ and/or HCl being fed jointly with the etching gas, in particular $ClF_3$.

Another subject matter of the exemplary embodiments and/or exemplary methods of the present invention relates to a device for carrying out the method according to the present invention, a device for producing the etching gas, for example, $ClF_3$ being associated with a process chamber, which is connected to the plasma reactor via a gas inlet, the semiconductor substrate being situated in the process chamber and exposed to the gaseous chlorine trifluoride produced by the device for producing chlorine trifluoride, the device having an additional gas supply arrangement, which includes another mass flow regulator, using which the feed of gas selected from the group including $Cl_2$ and/or HCl, which is supplied to the plasma reactor, the gas outlet of the plasma reactor, and/or a gas inlet of the process chamber, may be adjusted.

It is advantageous that the supply of the gas selected from the group including $Cl_2$ and/or HCl, which is supplied to the plasma reactor, the gas outlet, and/or the process chamber, is adjustable via another gas supply arrangement, which includes another mass flow regulator.

What is claimed is:

1. A method for etching an SiGe mixed semiconductor layer on a silicon semiconductor substrate, the method comprising:
   adding a gas, which includes at least one of $Cl_2$ and HCl, to the etching gas, wherein the etching gas includes at least one of $ClF_3$ and $ClF_5$; and
   dry chemical etching the SiGe mixed semiconductor layer with the aid of the etching gas and the added gas;
   wherein a ratio of partial pressures of the etching gas to the added gas, which includes at least one of $Cl_2$ and HCl, is in the range of ≥1:5 to ≤5:1, and
   wherein the etching is a plasma-less etch based on $ClF_3$ or $ClF_5$ and not a plasma etch, so that no plasma reaches a process chamber with the substrate.

2. The method of claim 1, wherein a partial pressure of the added gas, which includes at least one of $Cl_2$ and HCl, is in the range of ≥0.5 Pa to ≤500 Pa.

3. The method of claim 1, wherein a partial pressure of the etching gas, which includes at least one of $ClF_3$ and $ClF_5$, is in the range of ≥0.5 Pa to ≤500 Pa.

4. The method of claim 1, wherein a total pressure of the etching gas and added gas is in the range of ≥0.5 Pa to ≤1000 Pa.

5. The method of claim 1, wherein the $ClF_3$ etching gas is produced by generating a high-density plasma in a plasma reactor, a first gas including at least one of $Cl_2$ and HCl, and a second gas including at least one of $NF_3$, $F_2$, and $SF_6$, being supplied to the plasma reactor, and the gases reacting under the effect of the high-density plasma in the plasma reactor, forming chlorine trifluoride.

6. The method of claim 1, wherein an excess of a first gas including at least one of $Cl_2$ and HCl with respect to a second gas is supplied to a plasma reactor, a ratio of the gas flows of the first gas to the second gas being in the range of ≥1:3 to ≤4:1.

7. The method of claim 1, wherein the gas including at least one of $Cl_2$ and HCl is added to chlorine trifluoride, the chlorine trifluoride and the gas including at least one of $Cl_2$ and HCl being jointly supplied to a process chamber in which the etching takes place.

8. The method of claim 1, wherein the gas including at least one of $Cl_2$ and HCl is supplied to a process chamber separately from chlorine trifluoride.

9. The method of claim 1, wherein a ratio of partial pressures of the etching gas, which is $ClF_3$, to the added gas, which includes at least one of $Cl_2$ and HCl, is in the range of ≥1:5 to ≤5:1.

10. The method of claim 1, wherein a ratio of partial pressures of the etching gas, which is $ClF_3$, to the added gas, which includes at least one of $Cl_2$ and HCl, is in the range of ≥1:2 to ≤4:1.

11. The method of claim 1, wherein a ratio of partial pressures of the etching gas, which is $ClF_3$, to the added gas, which includes at least one of $Cl_2$ and HCl, is in the range of ≥1:1 to ≤2:1.

12. The method of claim 1, wherein a partial pressure of the added gas, which includes at least one of $Cl_2$ and HCl, is in the range of ≥1 Pa to ≤100 Pa.

13. The method of claim 1, wherein a partial pressure of the added gas, which includes at least one of $Cl_2$ and HCl, is in the range of ≥20 Pa to ≤50 Pa.

14. The method of claim 1, wherein a partial pressure of the etching gas, which includes at least one of $ClF_3$ and $ClF_5$, is in the range of ≥1 Pa to ≤100 Pa.

15. The method of claim 1, wherein a partial pressure of the etching gas, which includes at least one of $ClF_3$ and $ClF_5$, is in the range of ≥20 Pa to ≤50 Pa.

16. The method of claim 1, wherein a total pressure of the etching gas and added gas is in the range of ≥1 Pa to ≤200 Pa.

17. The method of claim 1, wherein a total pressure of the etching gas and added gas is in the range of ≥20 Pa to ≤100 Pa.

18. The method of claim 1, wherein the $ClF_3$ etching gas is produced by generating a high-density plasma in a plasma reactor, a first gas including at least one of $Cl_2$ and HCl, and a second gas including at least $NF_3$, being supplied to the plasma reactor, and the gases reacting under the effect of the high-density plasma in the plasma reactor, forming chlorine trifluoride.

19. The method of claim 1, wherein an excess of a first gas which includes at least one of $Cl_2$ and HCl with respect to a second gas, which is $NF_3$, is supplied to a plasma reactor, a ratio of the gas flows of the first gas to the second gas being in the range of $\geq 1:5$ to $\leq 6:1$.

20. The method of claim 1, wherein an excess of a first gas which includes at least one of $Cl_2$ and HCl with respect to a second gas, which is $NF_3$, is supplied to a plasma reactor, a ratio of the gas flows of the first gas to the second gas being in the range of $\geq 1:2$ to $\leq 2:1$.

21. The method of claim 1, wherein the $ClF_3$ etching gas is produced by generating a high-density plasma in a plasma reactor, a first gas including at least one of $Cl_2$ and HCl, and a second gas including at least one of $NF_3$, $F_2$, and $SF_6$, being supplied to the plasma reactor, and the gases reacting under the effect of the high-density plasma in the plasma reactor, forming chlorine trifluoride, wherein an excess of a first gas including at least one of $Cl_2$ and HCl with respect to a second gas is supplied to a plasma reactor, a ratio of the gas flows of the first gas to the second gas being in the range of $\geq 1:3$ to $\leq 4:1$, and wherein the gas including at least one of $Cl_2$ and HCl is added to chlorine trifluoride, the chlorine trifluoride and the gas including at least one of $Cl_2$ and HCl being jointly supplied to a process chamber in which the etching takes place.

22. The method of claim 1, wherein the $ClF_3$ etching gas is produced by generating a high-density plasma in a plasma reactor, a first gas including at least one of $Cl_2$ and HCl, and a second gas including at least one of $NF_3$, $F_2$, and $SF_6$, being supplied to the plasma reactor, and the gases reacting under the effect of the high-density plasma in the plasma reactor, forming chlorine trifluoride, wherein an excess of a first gas including at least one of $Cl_2$ and HCl with respect to a second gas is supplied to a plasma reactor, a ratio of the gas flows of the first gas to the second gas being in the range of $\geq 1:3$ to $\leq 4:1$, and wherein the gas including at least one of $Cl_2$ and HCl is supplied to a process chamber separately from chlorine trifluoride.

* * * * *